United States Patent [19]
Zimmermann

[11] Patent Number: 5,220,282
[45] Date of Patent: Jun. 15, 1993

[54] CIRCUIT ARRANGEMENT FOR IMPROVING RESOLUTION OF A SENSOR FOR DETERMINING ANGULAR POSITION OF A ROTATING MEMBER

[75] Inventor: Werner Zimmermann, Stuttgart, Fed. Rep. of Germany

[73] Assignee: Robert Bosch GmbH, Stuttgart, Fed. Rep. of Germany

[21] Appl. No.: 629,233

[22] Filed: Dec. 18, 1990

[30] Foreign Application Priority Data

Feb. 6, 1990 [DE] Fed. Rep. of Germany ....... 4003453

[51] Int. Cl.$^5$ ............................ G01B 7/30; G01B 7/14
[52] U.S. Cl. ............................ 324/207.12; 324/207.13; 324/207.25
[58] Field of Search ................. 324/207.12, 207.13, 324/207.14, 207.15, 207.22, 207.25, 225, 173, 166

[56] References Cited

U.S. PATENT DOCUMENTS 4,380,733  4/1983  Yano et al. ........................ 324/166

Primary Examiner—Walter E. Snow
Attorney, Agent, or Firm—Michael J. Striker

[57] ABSTRACT

A circuit arrangement for determining a high-resolution angular position of a rotating member includes a sensor (7) for delivering relatively low resolution measuring signals which are applied to a circuit arrangement (11) for converting the measuring signals into a high-resolution indication of the angle of rotation. The circuit arrangement includes an evaluation circuit with a memory for storing high-resolution angle values, a controllable counter for controlling the memory and operating at two frequencies (f1 and f2), a comparator for comparing the output signals of the sensor and of the memory to change, via a regulating circuit, the counting rate of the counter from f1 to f2 in dependency on the result of the comparison. The count (i) of the counter represents a measure of the high-resolution angle of rotation.

10 Claims, 2 Drawing Sheets

CIRCUIT ARRANGEMENT FOR IMPROVING RESOLUTION OF A SENSOR FOR DETERMINING ANGULAR POSITION OF A ROTATING MEMBER

BACKGROUND OF THE INVENTION

The present invention relates to a circuit arrangement for determining the angular position of a rotating member, particularly of a rotating shaft of an internal combustion (or I.C.) engine, by means of a counter and a sensor which detects the angular position of the shaft. The output signal of the sensor is fed to an evaluating circuit whose resolution of the detected angular position is greater than that of the sensor. A synchronizing circuit provides synchronization or an independent time control between the output signal of the sensor and the concurrent high resolution angle of rotation delivered by the evaluating circuit.

The determination of the angular position of a rotating member is a task which frequently occurs in the art. For example, in the motor vehicle technology it is required for the control of an internal combustion engine to determine the angular position of its cam shaft or crankshaft so that a control apparatus could perform its controlling function at correct time points.

Known are systems for measuring angle rotation which include a sensor consisting of two transmitters or pickups. The pickups are displaced by an angle relative to each other and determine the respective angular positions of a rotating member by scanning thereon markings or the like which are distributed around the circumference of the member. The disadvantage of this prior art system is the fact that the resolution of the measuring signal is limited by the available number of the markings.

From the U.S. Pat. No. 3,830,207 a control device for the ignition and fuel injection of an I.C. engine is known wherein markings on the cam shaft and on the crankshaft are scanned by sensors. The output signals of the sensors are applied to an evaluating circuit. The sensor assigned to the crankshaft includes two transmitters or pickups which form one with the other an angle of 30 degrees. By the provision of two sensors and due to the fact that the cam shaft rotates at half the speed of the crankshaft it is possible to limit the errors or tolerances in the determination of the angular position of the crankshaft inasmuch as the maximal error is always between the respective maximum errors of the crankshaft and the cam shaft. Owing to the smaller rotary speed of the cam shaft an error which at the crankshaft may amount for example to 10 degrees is reduced to 5 degrees. To that extent the prior art arrangement provides a relatively precise determination of ignition- and fuel injection time points of the I.C. engine. Nevertheless, there is still the need to improve the accuracy.

The prior art circuit arrangements of the above described kind are available as the so-called 'Tachogenerator Outputs' and make a relatively exact determination of the angular position possible.

SUMMARY OF THE INVENTION

An object of the circuit arrangement according to the invention is to provide by simple means a higher resolution in the determination of the angular position of a rotating member, thus achieving a higher measuring accuracy at reduced cost.

Another object of the invention is to enable a presetting of the desired resolution of the result of measurement such that the indication of the angular position of the rotating member can be preselected for an arbitrarily high resolution.

In keeping with these objects and others which will become apparent hereafter, one feature of the circuit arrangement according to the invention resides in the provision of means for changing counting rate of the counter in response to output states of a comparator which compares output signals of the sensor. At one state of the comparator, the count (i) changes at a frequency f1 while at the other state the count changes at another frequency f2.

If the circuit arrangement of the invention is employed for example for determining angular position of a cam shaft of an I.C. engine, then by virtue of the extremely precise measuring results an exact management of operational economy and effectiveness can be realized by taking into account all momentary operational conditions.

By detecting the angular position of a rotating member by means of a sensor, in the first instance an output signal defining a relatively small resolution of the angular position is generated. The sensor output signal is utilized for driving a synchronizing circuit which secures synchronization between the sensor output signal and a high resolution rotational angle signal delivered by the evaluation circuit. The degree of angular resolution of the latter signal is selectable in arbitrarily fine steps whereby it is always guaranteed that the coarse resolution angular position signal delivered by the sensor is in synchronism with the high resolution signal. As mentioned above, this task is performed by the synchronizing circuit. Preferably, the high resolution angular position signal is generated in digital form. Depending on the selection of the length of the digital words stored in a memory and representing the angular position signal, the degree of resolution can be controlled.

According to the invention, the adjustment of the counting speed of the counter is effected by a comparator which compares the analog output signals of the sensor and, in one output state thereof, controls the change of count of the counter at a frequency f1 and in the other state at a different frequency f2. In this manner the counting speed of the counter is adjusted by very simple means. The comparator is a part of the synchronizing circuit which, by controlling or regulating the counting speed of the counter takes care of the synchronization between the analog sensor signal and the digital output of the counter.

In a preferred embodiment of the invention, the sensor includes two pickups or transmitters which are displaced one to the other by 90 degrees. Due to the angular displacement, of the two pickups the output signals x and y meet the following equations:

$$x = \sin(Z \cdot a)$$

and $$y = \cos(Z \cdot a)$$

wherein Z denotes the number of markings uniformly distributed on the circumference of the rotating member and being periodically detected by the sensor, and a denotes the angle of rotation of the rotating member measured by the sensor.

In the preferred embodiment, the synchronizing circuit effects the synchronization by means of a regulating circuit which insures particularly exact results.

According to a further elaboration of the invention, the output signals of the respective pickups are fed to analog parts of corresponding digital-analog (D/A) convertors. To the inputs of digital parts of the D/A convertors are applied the higher resolution angular position signals read out from a memory and representing the following functions:

$$u = \cos b$$

$$v = \sin b$$

wherein
b = 360 degrees, i/k,
the of the count factor k is a number 4 i = 0, 1, 2, ... k-1
and the resolution $$A \times 360 \text{ degrees}/(K \cdot Z)$$

is adjustable by the selection of k.

The sine- and cosine functions u and v are delivered by the evaluation circuit. With advantage, digital data of the functions u and v are stored in the form of a table in the memory. The memory is controlled by the counter whose count represents the high resolution values of the angle of rotation. With each revolution of the rotating member and depending on the direction of rotation the counter runs from a minimum count to a maximum count or from a maximum count to a minimum count whereby each intermediate count corresponds to a certain intermediate value of the angle of rotation. The number of the intermediate values (counts) of the counter is selectable by which the selection of the factor k and thus the resolution of the angular position is also adjustable.

The output signals of the above mentioned D/A convertors represent the following functions:

$$s = \sin(Z \cdot a) \cdot \cos b$$

and $$t = \cos(Z \cdot a) \cdot \sin b.$$

The two output signals are fed to a comparator whose output states control the counting rate of the counter. The comparator thus belongs to the synchonizing circuit which controls the counting speed of the counter to be in synchronism with the output values of the two pickups.

Preferably, the control of the counter by the comparator is performed such that the count changes at a higher frequency f1 when the value of the function (or signal) s is greater than the value of the function (or signal) t, and at a lower frequency f2 if the value of the function s is less than that of the function. The two frequencies f1 and f2 are preferably constant and selected with respect to the range $$n_{min} < n < n_{max}$$

of the rotary speed n of the rotating member such as to meet:

$$f1 > k \cdot Z \cdot n$$

and $$f2 < k \cdot Z \cdot n,$$

wherein the factor k is a number > 4.

BRIEF DESCRIPTION OF THE DRAWING

The invention will be explained in greater detail in the following description of the preferred embodiment when viewed in connection with the accompanying drawing, wherein.

DESCRIPTION OF THE PREFERRED EMBODIMENT

Figure 1:
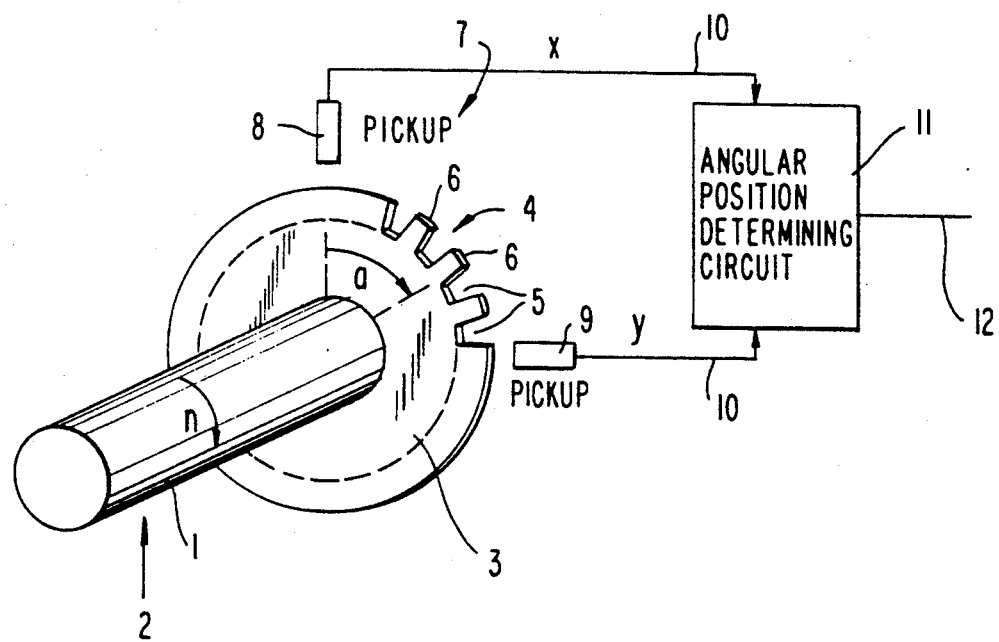
FIG. 1 is a schematic perspective view of a device for determining angle of rotation of a shaft.

FIG. 1 illustrates a shaft 1 rotating at a speed n. The shaft 1 can be for example a cam shaft of an I.C. engine or other rotating member 2 whose angular position, that is its angle of rotation "a" at a time point under consideration, is to be determined. For this purpose, a transmitter wheel 3 provided on its circumference with uniformly distributed markings 4, is firmly connected to the shaft 1. In this example, the markings 4 (of which for the sake of simplicity only a few are illustrated in FIG. 1), are in the form of teeth 6 separated by gaps 5.

The markings of the transmitter wheel cooperate with a sensor 7 consisting of two pickups 8 and 9 which are mutually staggered or displaced by 90 degrees and located opposite the circumference of the wheel 3. The pickups can be constructed as field plate- or as induction pickups. The output conductors 10 from the pickups are connected to an angular position determining circuit 11 delivering at its output 12 a signal which corresponds to the momentary high resolution angle of rotation of the shaft 1.

The output signals x and y at the output lines 10 of the pickups 8 and 9 define the functions $$x = \sin(Z \cdot a)$$

and $$y = \cos(Z \cdot a),$$

that means the two pickups deliver two phase-shifted periodic signals which, disregarding higher harmonics contained therein, conform to a sine- and a cosine function, respectively. "Z" represents the number of markings 4 which are uniformly distributed on the circumference of the transmitter wheel 3 and detected by the sensor 7. The measured coarse angle of rotation is designated by "a".

The objective of the circuit 11 is to improve the coarse resolution of the angle of rotation obtained through the sensing of the markings 4, that means to provide a very high resolution readout of the rotational angle. Preferably, the high resolution rotational angle is read out in digital form.

Figure 2:
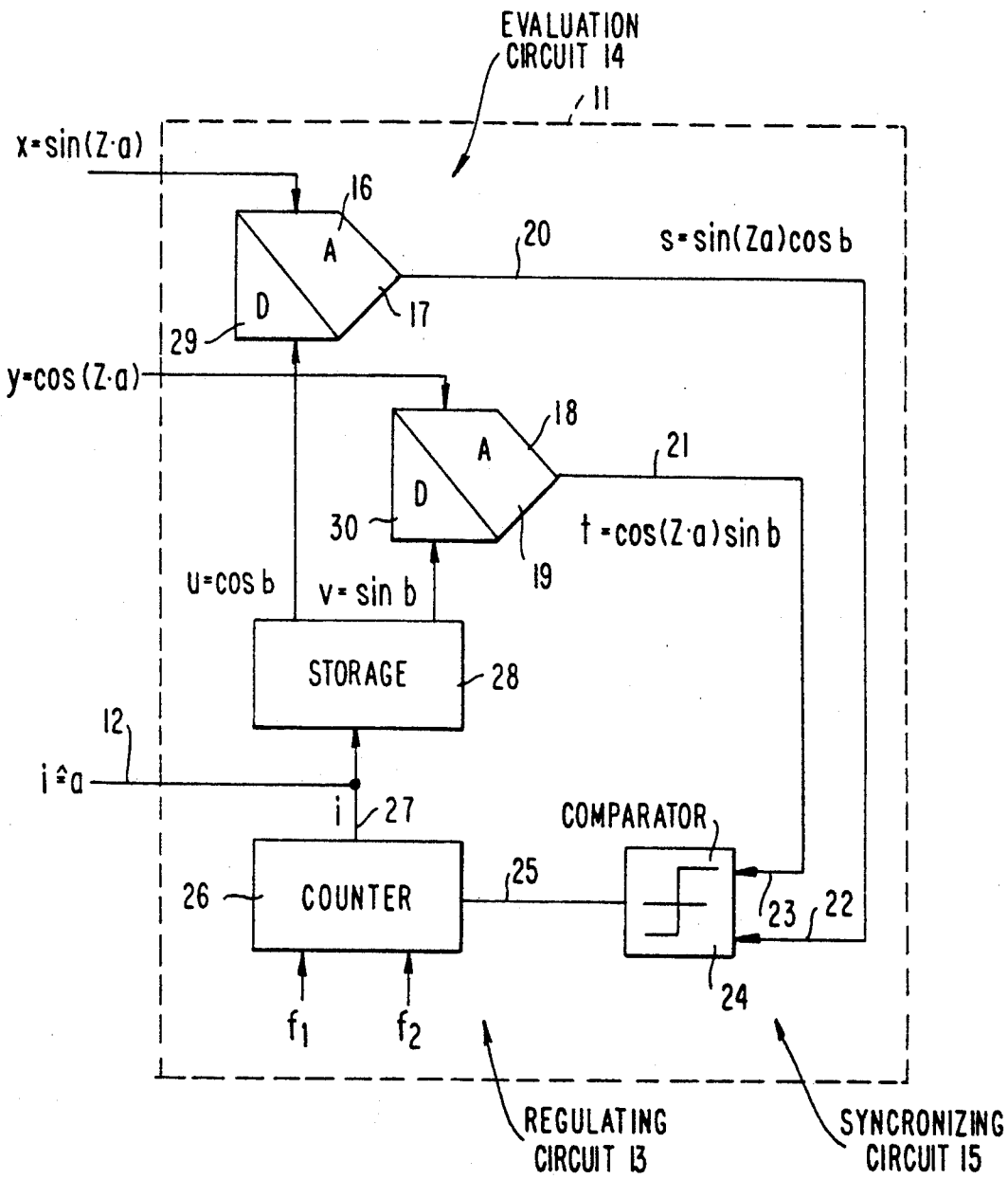
FIG. 2 is a circuit arrangement for improving the resolution of the angular position of the rotating shaft in the device of FIG. 1.

The angular position determining circuit 11 is illustrated in greater detail in FIG. 2. It includes a regulating circuit 13, an evaluation circuit 14 and a synchronizing circuit 15.

To the analog part 17 of a first multiplying digital-to-analog converter 16 is applied the sine-function signal x.

In addition, there is provided a second digital-to-analog converter 18 whose analog part 19 is supplied with the cosine-function signal y. The outputs of the two D/A converters 16 and 18 lead to inputs 22 and 23 of a comparator 24. The output 25 of the comparator is connected to a control input of a counter 26 to which two input signals are supplied at constant frequencies f1 and f2. The frequencies f1 and f2 are selected such that in the range $$n_{min} < n < n_{max}$$

of rotary speed n of the shaft 1, the following unequalities are valid:

$$f1 > k \cdot Z \cdot n$$

and $$f2 < k \cdot Z \cdot n,$$

wherein k is a number > 4, selected according to the desired increase of resolution.

The output signal of comparator 24, controls the counter 26 to count at the frequency f1 or f2. Depending on the direction of counting of the counter, it is possible to count "up" (f1 and/or f2 > 0) or down (f1 and/or f2 < 0). The resulting count i at the output line 12 connected to the output 27 of the counter 26 represents a measure for a high-resolution rotational angle a. The rotational angle i is indicated in digital form and through the selection of the factor "k" it can be adjusted for a theoretically arbitrarily high resolution $$A = 360 \text{ degree}/(k \cdot Z).$$

since according to the preferred embodiment the counter 26 can count in positive or negative direction, it can be selectively driven as a forward- or backward counter. The output 27 of the counter leads to a memory or storage 28 which stores, preferably in the form of tables, the values of the functions $$u = \cos b$$

and $$v = \sin b,$$

wherein $$b = 360 \text{ degrees}, i/k$$

and $$\text{count values } i = 0, 1, 2, \ldots k - 1$$

and, as mentioned before, the magnitude of the resolution A is determined by the selection of the factor k.

The digital values of the function u are fed from the storage 28 to the input of digital part 29 of the first digital-to-analog converter 16, and the values of the function v to the input of digital part 30 of the second digital-to-analog converter 18. Consequently, at the output 20 of the first D/A converter 16 results a function $$s = \sin (Z \cdot a) \cdot \cos b$$

and, at the output 21 of the second D/A converter 18 a function $$t = \cos (Z \cdot a) \cdot \sin b.$$

The control of the counter 26 by the comparator 24 ensues in such a manner that the count i changes at the frequency f1 when the value of the function s is greater than that of the function t, and changes at the frequency f2 when the value of the function s is less than the value of the function t.

When in operation of the circuit 11 the value b becomes less than the product $Z \cdot a$, the value of the function s becomes greater than that of the function t. As a result, the output 25 of the comparator controls the counter 26 to change its count at the frequency f1, thus causing the value b to increase faster than the angle $Z \cdot a$. If b is larger than $Z \cdot a$, the value of function s becomes smaller than the value of function t, the comparator 24 controls the counter 26 to count at the frequency f2 such that the value b grows slower than the angle $Z \cdot a$. The synchronization circuit 15 continuously ensures synchronism between the output signals of the sensor 7 and the accompanying high-resolution rotational angle determining signals originating in the circuit 11. Through the selection of "k", as mentioned before, the resolution A of the measured angle of rotation can in theory be adjusted arbitrarily high. Accordingly, the circuit arrangement of the invention makes it possible to detect with a high resolution the angular position of a rotating member.

It will be understood that each of the elements described above, or two or more together, may also find a useful application in other types of constructions differing from the types described above.

While the invention has been illustrated and described as embodied in a circuit arrangement for determining angular position of a rotating member, it is not intended to be limited to the details shown, since various modifications and structural changes may be made without departing in any way from the spirit of the present.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

I claim:

1. A circuit arrangement for determining an angular position of a rotating member, particularly a shaft of an internal combustion engine, said circuit arrangement comprising means for sensing an angular position of the rotating member and generating output signals having a relatively low resolution according to said angular position; means for evaluating the output signals having the low resolution from the sensing means to generate output signals having a high resolution; means for synchronizing the output signals having the high resolution from the evaluating means with the output signals having the low resolution of the sensing means; said evaluating means including a memory for storing high-resolution angle values, a counter connected between said memory and said synchronizing means to deliver a count i indicative of the high-resolution angular position of said rotating member; and said synchronizing means including a comparator of said output signals of the evaluating means, said comparator controlling in one state thereof a rate of change of the count of the counter by admitting into the counter an input signal at a first frequency (f1) and, in the other state thereof, and input signal at a second frequency (f2).

2. A circuit arrangement as defined in claim 1 wherein said sensing means include two pickups for sensing markings on the rotating member, the pickups being shifted by 90 degrees one to the other.

3. A circuit arrangement as defined in claim 2 wherein the output signal of one of the two pickups defines the function $$x = \sin(Z \cdot a)$$

an the output signal of the other pickup the function $$y = \cos(Z \cdot a),$$

wherein Z is the number of markings uniformly distributed on the circumference of the rotating member, and a denotes the rotating angle measured by the sensing means.

4. A circuit arrangement as defined in claim 3 wherein the evaluating means include two multiplying digital-to-analog converters and the output signals from the sensing means are applied to the analog parts of the respective converters.

5. A circuit arrangement as defined in claim 4, further comprising means for applying to the digital parts of the respective digital-to-analog converters signals from said memory representing the functions $$u = \cos b$$

and $$v = \sin b,$$

wherein $$b = 360 \text{ degr} \cdot i/k,$$

$$k > 4,$$

and $$i = 0, 1, 2, \ldots k-1,$$

and the desired high resolution $$A = 360 \text{ degr}(k \cdot Z)$$

is determined by the selection of k.

6. A circuit arrangement as defined in claim 5, wherein the said memory stores tables of values of said functions u and v.

7. A circuit arrangement as defined in claim 6, wherein said memory is controlled by the count (i) at an output of said counter.

8. A circuit arrangement as defined in claim 7, wherein output signals of the respective digital-to-analog converters which are supplied to the inputs of said comparator represent the functions $$s = \sin(Z \cdot a) \cdot \cos b$$

and $$t = \cos(Z \cdot a) \cdot \sin b.$$

9. A circuit arrangement as defined in claim 8, wherein the comparator output is at one state when a value of the function s is greater than that of the function t, and at the other state when the value of the function s is less than the value of the function t.

10. A circuit arrangement as defined in claim 9, wherein the two frequencies (f1 and f2) are constant and selected such that for the speed range $$n_{min} < n < n_{max}$$

of the rotating member the unequalities $$f1 > k \cdot Z \cdot n$$

and $$f2 < k \cdot Z \cdot n$$

are valid, whereby $k > 4$.

* * * * *